(12) United States Patent
Trejo et al.

(10) Patent No.: US 10,541,159 B2
(45) Date of Patent: Jan. 21, 2020

(54) PROCESSING CHAMBER WITH IRRADIANCE CURING LENS

(71) Applicant: Applied Materials, Inc., Santa Clara, CA (US)

(72) Inventors: Orlando Trejo, Sunnyvale, CA (US); Ramprakash Sankarakrishnan, Santa Clara, CA (US); Tza-Jing Gung, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/165,930

(22) Filed: May 26, 2016

(65) Prior Publication Data
US 2017/0345649 A1   Nov. 30, 2017

(51) Int. Cl.
*H01L 21/67* (2006.01)
*G02B 19/00* (2006.01)
*G02B 3/08* (2006.01)

(52) U.S. Cl.
CPC .......... *H01L 21/67115* (2013.01); *G02B 3/08* (2013.01); *G02B 19/0047* (2013.01); *G02B 19/0095* (2013.01)

(58) Field of Classification Search
CPC ............ G02B 19/0019; G02B 19/0047; G02B 19/0095; H01L 21/02348; H01L 21/67115
See application file for complete search history.

(56) References Cited

U.S. PATENT DOCUMENTS

| | | | | |
|---|---|---|---|---|
| 4,755,654 A | * | 7/1988 | Crowley | C23C 16/04 118/725 |
| 5,288,684 A | * | 2/1994 | Yamazaki | C23C 16/482 118/719 |
| 6,862,404 B1 | * | 3/2005 | Yoo | H01L 21/67115 118/50.1 |
| 6,879,777 B2 | | 4/2005 | Goodman et al. | |

(Continued)

FOREIGN PATENT DOCUMENTS

| JP | 2007229682 A | 9/2007 |
|---|---|---|
| KR | 20130112549 A | 10/2013 |

OTHER PUBLICATIONS

International Search Report and Written Opinion for PCT/US2017/034622 dated Aug. 23, 2017.

*Primary Examiner* — Dale E Page
*Assistant Examiner* — Quovaunda Jefferson
(74) *Attorney, Agent, or Firm* — Patterson + Sheridan, LLP

(57) ABSTRACT

Embodiments disclosed herein relate to a processing chamber having a lens disposed therein. In one embodiment, the processing chamber includes a chamber body, a substrate support assembly, a light source, and a lens. The chamber body defines an interior volume of the processing chamber. The interior volume has a first area and a second area. The substrate support assembly is disposed in the second area. The substrate support assembly is configured to support a substrate. The light source is disposed above the substrate support assembly in the first area. The lens is disposed between the light source and the substrate support assembly. The lens includes a plurality of features formed therein. The plurality of features is configured to preferentially direct light from the light source to an area of interest on the substrate when disposed on the substrate support assembly.

6 Claims, 4 Drawing Sheets

(56) References Cited

U.S. PATENT DOCUMENTS

| | | | |
|---|---|---|---|
| 8,137,465 B1* | 3/2012 | Shrinivasan | C23C 16/56 |
| | | | 118/719 |
| 2002/0094613 A1* | 7/2002 | Yamazaki | H01L 21/268 |
| | | | 438/151 |
| 2003/0031031 A1* | 2/2003 | Tiao | G02B 6/0006 |
| | | | 362/560 |
| 2010/0261349 A1* | 10/2010 | van Schravendijk | |
| | | | H01L 21/3105 |
| | | | 438/675 |
| 2012/0129275 A1* | 5/2012 | Yang | H01L 21/67115 |
| | | | 438/5 |
| 2013/0122611 A1 | 5/2013 | Yang et al. | |
| 2013/0284095 A1 | 10/2013 | Ranish | |
| 2013/0320235 A1 | 12/2013 | Lien et al. | |
| 2015/0144292 A1 | 5/2015 | Pham et al. | |

* cited by examiner

PROCESSING CHAMBER WITH IRRADIANCE CURING LENS

BACKGROUND

Field

Embodiments described herein generally relate to a processing chamber, and more specifically, to an ultra-violet (UV) curing chamber for UV curing of thin films on a substrate.

Description of the Related Art

Silicon containing materials such as silicon oxide, silicon carbide and carbon doped silicon oxide films are frequently used in the fabrication of semiconductor devices. Silicon-containing films can be deposited on a semiconductor substrate through various deposition processes, one example of which is chemical vapor deposition (CVD). For example, a semiconductor substrate may be positioned within a CVD chamber, and a silicon containing compound may be supplied along with an oxygen source to react and deposit a silicon oxide film on the substrate. In other examples, organosilicon sources may be used to deposit a film having Si—C bond. Film layers made by CVD processes may also be stacked to form composite films. In some processes, ultraviolet (UV) radiation can be used to cure, densify, and/or relieve internal stresses of films or film layers created by the deposition process. Additionally, byproducts such as water, organic fragments, or undesired bonds may be reduced or eliminated. The use of UV radiation for curing and densifying CVD films can also reduce the overall thermal budget of an individual wafer and speed up the fabrication process.

UV curing of thin films oftentimes results in radial non-uniformities on the surface of the substrate. Characteristics such as thickness, density, and shrinkage may differ across the substrate. Currently, control of processing parameters is used to optimize on-substrate uniformity without having the change hardware components. Unfortunately, these controls cannot address all uniformity issues present during UV curing.

Thus, there is a need for an improved UV curing chamber.

SUMMARY

Embodiments disclosed herein relate to a processing chamber having a lens for enhancing UV curing. In one embodiment, the processing chamber includes a chamber body, a substrate support assembly, a light source, and a lens. The chamber body defines an interior volume of the processing chamber. The interior volume has a first area and a second area. The substrate support assembly is disposed in the second area. The substrate support assembly is configured to support a substrate. The light source is disposed above the substrate support assembly in the first area. The lens includes a plurality of features formed therein. The plurality of features is configured to direct light from the light source to an area of interest on the substrate when positioned on the substrate support assembly.

In another embodiment, a processing chamber is disclosed herein. The processing chamber includes a chamber body, a substrate support assembly, a light source, a primary reflector, a secondary reflector, and a lens. The chamber body defines an interior volume of the processing chamber. The interior volume has a first area and a second area. The substrate support assembly is disposed in the second area. The substrate support assembly is configured to support a substrate. The light source is disposed above the substrate support assembly in the first area. The primary reflector is disposed in the first area. The primary reflector at least partially surrounds the light source. The secondary reflector is disposed in the first area below the primary reflector and above the substrate support assembly. The secondary reflector is configured to channel light from the light source to a surface of the substrate. The lens is disposed in the interior volume. The lens has a plurality of features formed therein. The features are configured to direct the channeled light from the secondary reflector to an area of interest on the substrate.

In another embodiment, a method of UV processing a substrate is disclosed herein. The method includes channeling UV light using a reflector. The channeled UV light is directed with a lens having a plurality of features formed therein towards an area of interest on the substrate positioned in a UV processing chamber. The method further includes changing a property of the film by exposure to the directed UV light.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
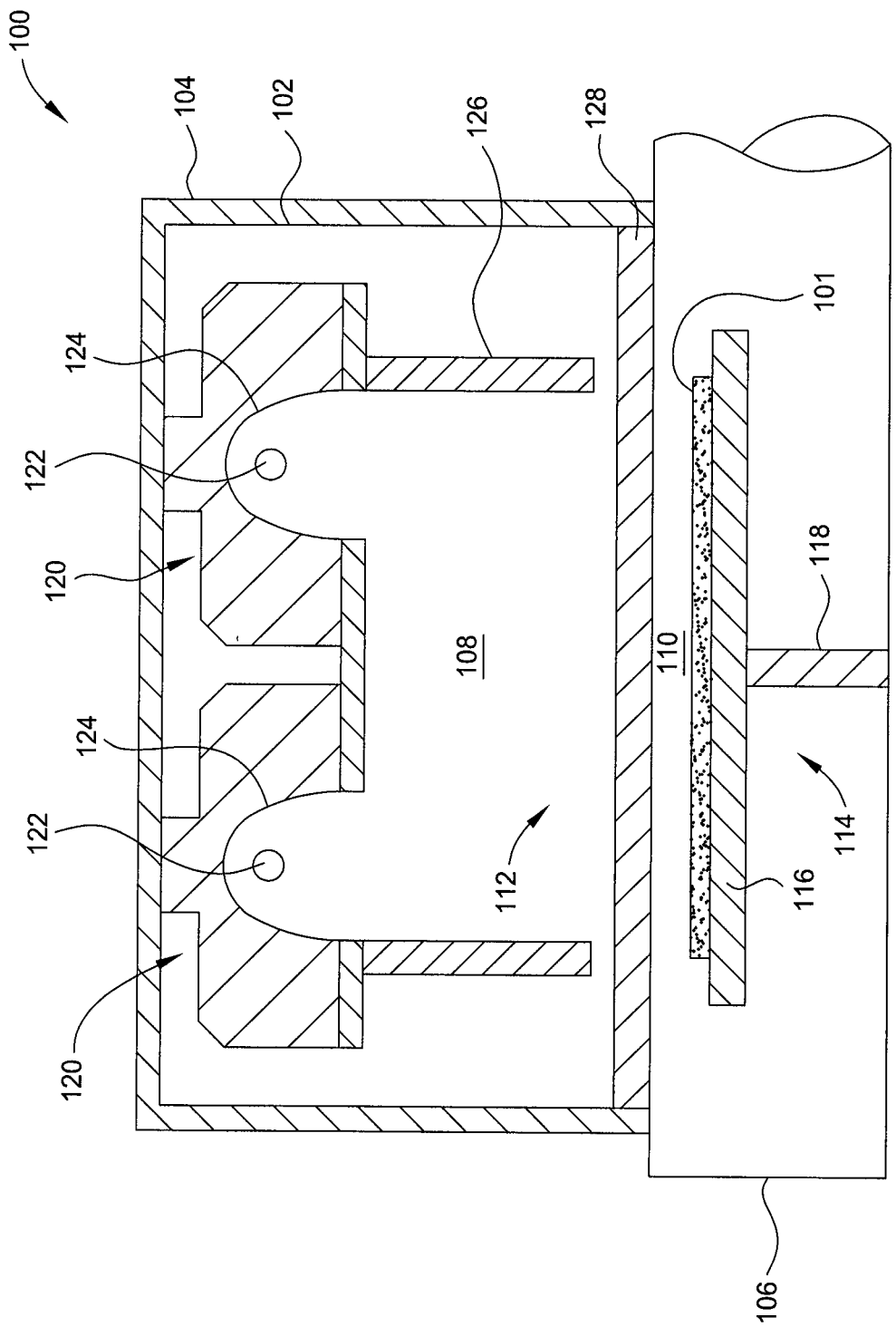
FIG. 1 is a cross-sectional view of a curing chamber, according to one embodiment.

FIG. 1 illustrates a cross-sectional view of a UV processing chamber 100 with a lens 128 configured to direct UV light within the chamber 100, according to one embodiment. The UV processing chamber 100 includes a chamber body 102. The chamber body 102 includes an upper housing 104 and a lower housing 106. The upper housing 104 defines an upper area 108. The lower housing 106 defines a lower area 110 below the upper area 108. The upper area 108 and the lower area 110 collectively define an interior volume 112 of the UV processing chamber 100.

The UV processing chamber 100 further includes a substrate support assembly 114 disposed in the lower area 110. The substrate support assembly 114 includes a support plate 116 and a stem 118 coupled to the support plate 116. The support plate 116 is configured to support a substrate 101 during processing.

The UV processing chamber 100 may further include a light source 120 and a primary reflector 124 disposed in the upper area 108. The light source 120 may be, for example, a UV lamp. The light source 120 includes a bulb 122. The bulb 122 may be at least partially surrounded by the primary reflector 124. The primary reflector 124 is configured to reflect the light radiation towards the substrate support assembly 114. In one embodiment, the UV processing chamber 100 further includes a secondary reflector 126 disposed in the upper area 108. The secondary reflector 126 is positioned beneath the primary reflector 124 and above the substrate support assembly 114. The secondary reflector 126 has a diameter that is smaller than a diameter of the substrate. This ensures that there is no gap between the secondary reflector 126 and the outside diameter of the substrate 101 as viewed from the direction of the light source 120. The secondary reflector 126 functions to channel the light generated by the bulb 122, reflecting the light that would otherwise fall outside on the boundary of the primary reflectors' flood pattern such that the radiation impinges upon the substrate 101, thus allowing the substrate 101 to be UV processed.

Conventionally, several variable process control parameters (i.e., knobs) are used to adjust process uniformity without the need to change hardware components. For example, these knobs may include controlling the spacing between the substrate 101 and the light source 120, controlling the intensity of the bulb 122, position and shape of the primary reflectors 124, and the position and shape of the secondary reflector 126. However, these knobs may be difficult to optimize the uniformity of substrate processing results across the entire width of the substrate 101. However, a knob to control the intensity near the edge of the substrate 101 is not currently available.

The UV processing chamber 100 further includes a lens 128 disposed between the upper housing 104 and the lower housing 106. The lens 128 functions as an additional knob to control substrate processing uniformity in specific zones of the substrate. In one embodiment, the lens 128 may act as a knob to control the substrate uniformity near the edge of the substrate 101. The lens 128 may be formed from a transparent material, such as quartz. The lens 128 is configured to direct the light from the secondary reflector 126 to a region of interest (or zone) on the substrate. For example, light rays may be lost to the chamber body and walls during curing. The lens 128 may be configured to redirect the light that would be otherwise lost to the chamber body to the surface of the substrate 101. This allows for better uniformity along the surface of the substrate 101 due to additional light rays contacting the surface of the substrate 101.

Figure 4:
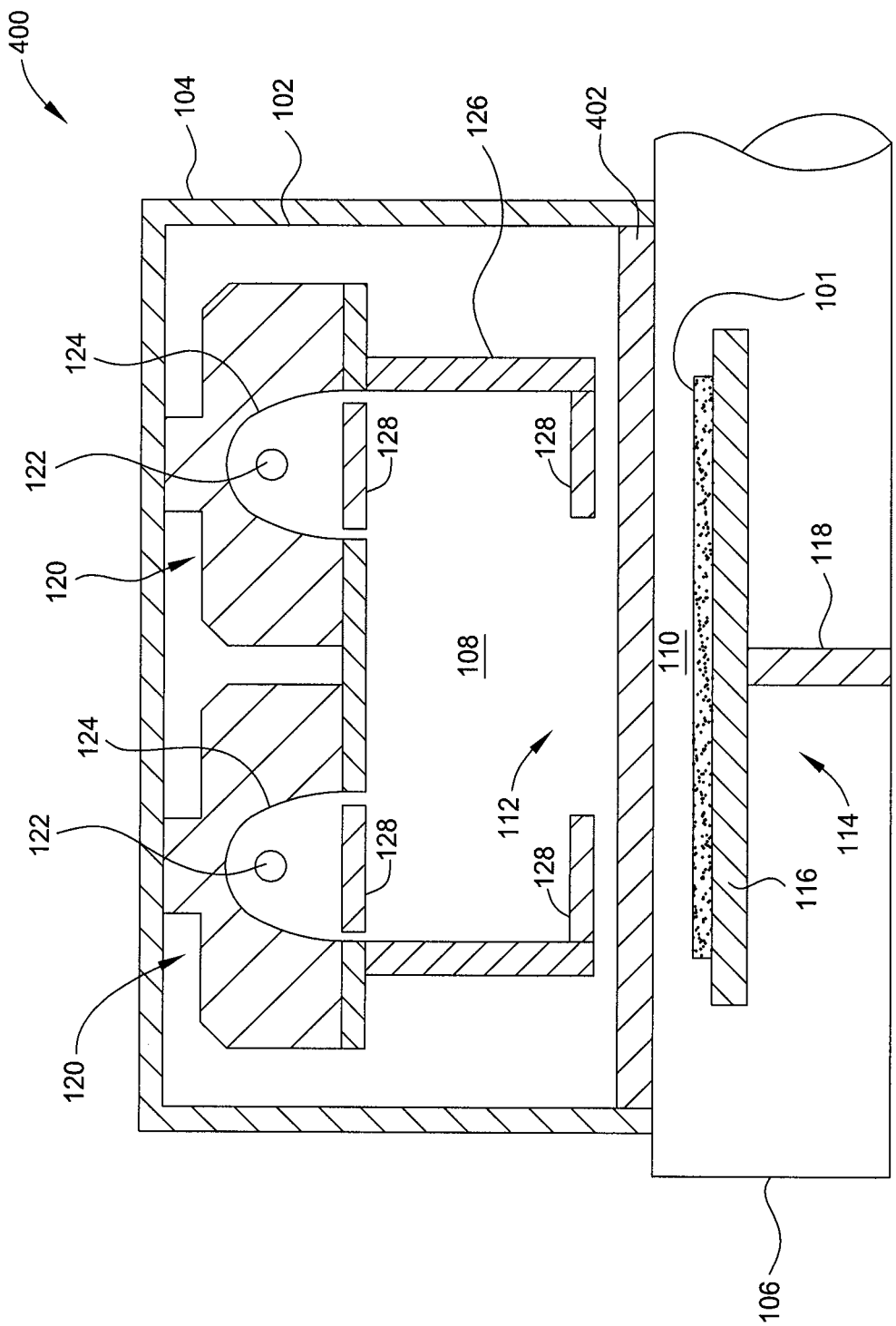
FIG. 4 is a cross-sectional view of a UV curing chamber, according to another embodiment.

FIG. 4 illustrates a UV processing chamber 400, according to another example. The UV processing chamber 400 is substantially similar to UV processing chamber 100. The location of the lens 128 in FIG. 1 is replaced with a quartz window 402, positioned between the upper housing 104 and the lower housing 106 in UV processing chamber 400. The UV processing chamber 400 further includes one or more lenses 128. In one embodiment, the one or more lenses 128 may be positioned beneath the primary reflectors 124. In another embodiment, the one or more lenses 128 may be positioned near the secondary reflector 126. As illustrated in FIG. 4, one or more lenses 128 are positioned beneath the primary reflectors 124 and near the secondary reflector 126.

Figure 2:
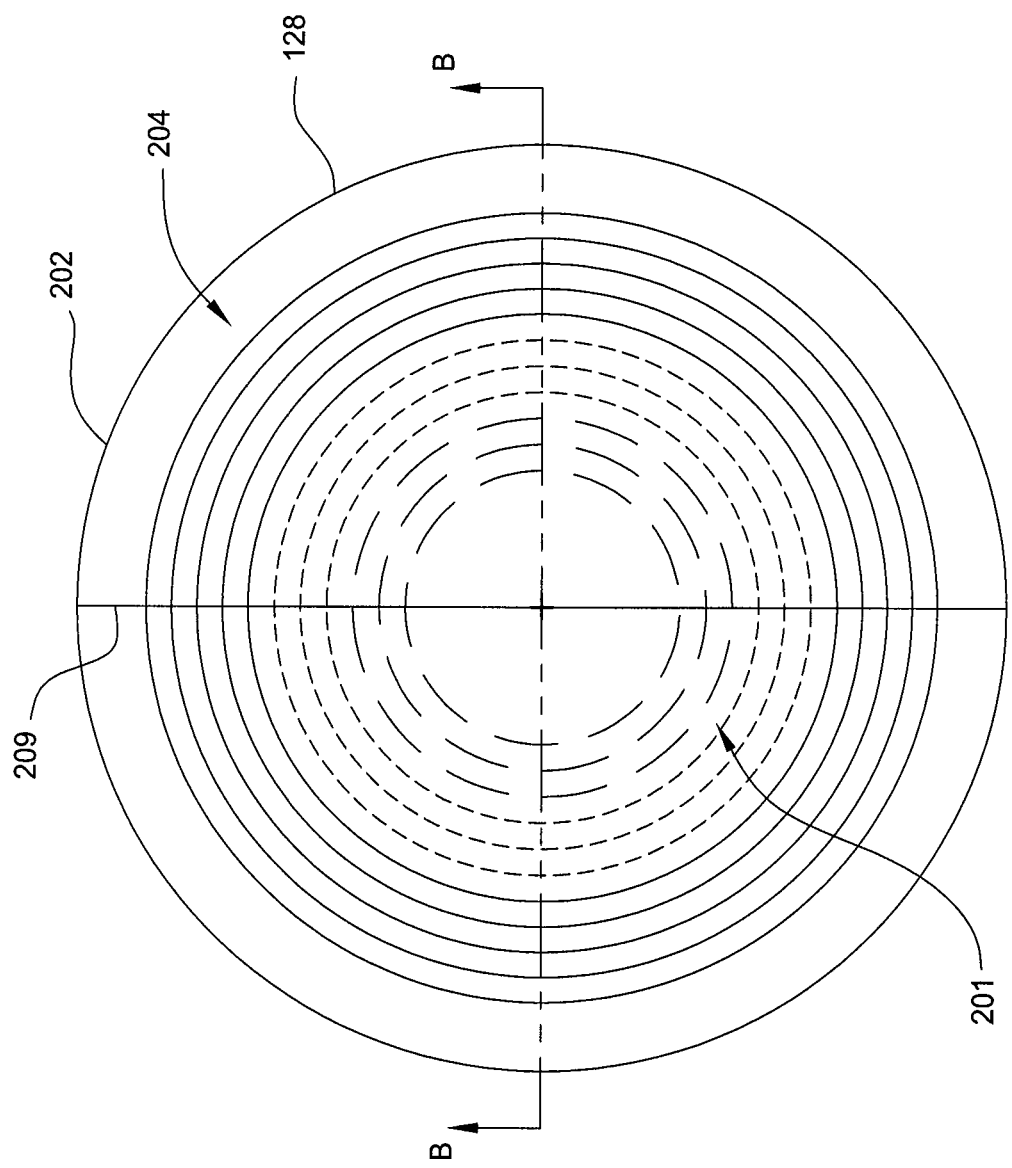
FIG. 2 is a top view of a lens of FIG. 1, according to one embodiment.
Figure 3:
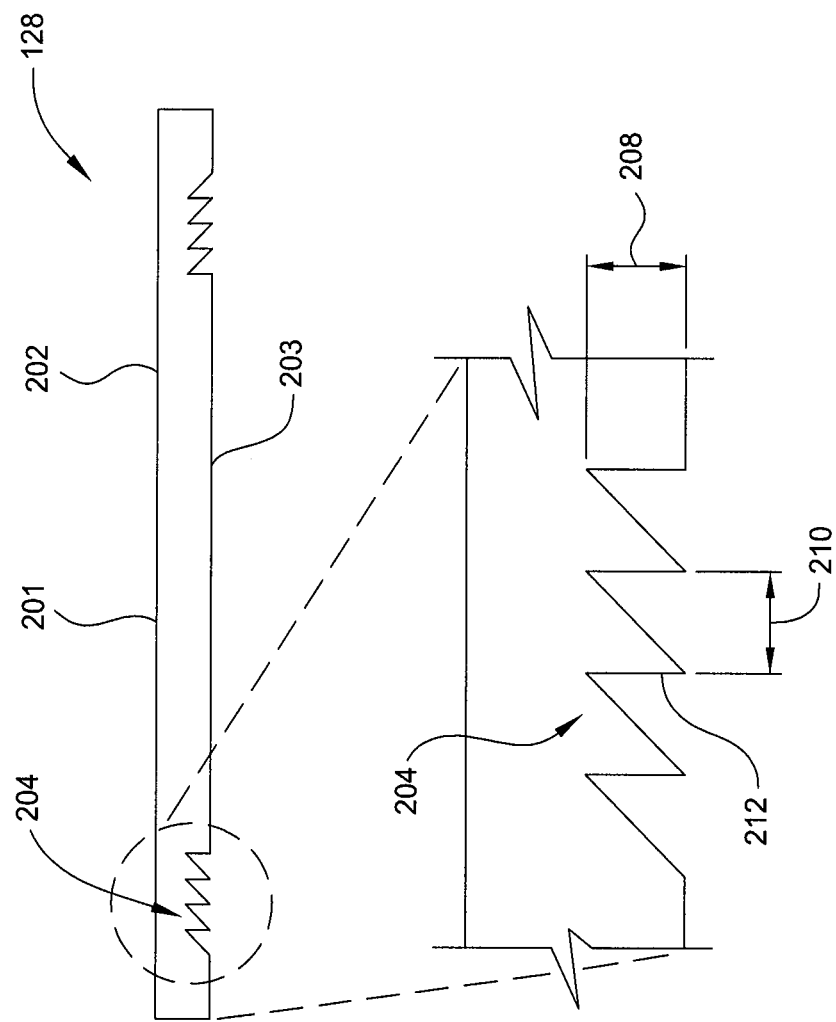
FIG. 3 is a cross-sectional view of the lens of FIG. 2, taken across the B-B line, according to one embodiment.

FIGS. 2 and 3 illustrate the lens 128, according to one embodiment. FIG. 2 illustrates a top view of the lens 128. FIG. 3 illustrate a cross-sectional view of the lens 128, taken across the B-B line. The lens 128 includes body 202 having a top surface 201 and a bottom surface 203. The body 202 may have a diameter 209 that is greater than the diameter of the secondary reflector 126. In one embodiment, the diameter 209 of the lens 128 is greater than the diameter of the substrate 101. The body may have a thickness of about 1 inch.

The body includes a plurality of features 204 formed in a bottom surface 203 of the body 202. In one embodiment, the features 204 may be formed in a lens 128 having a thickness of about 1 inch. The features 204 may extend at least partially into the body 202. The features 204 may be formed from concentric circles formed into the body 202 of the lens 128. In one embodiment, the features 204 may be etched, ground, or engraved into the lens 128. In another embodiment, the features 204 may be machined into the lens 128. In another embodiment, the features 204 may be formed exterior to the body 202, such that the features 204 extend out from the body 202.

The features 204 may be etched such that the features 204 have a specific depth 208, spacing 210, and angle 212 to direct the incoming light from the bulb to a specific area on the substrate 101. The depth 208, spacing 210, and angle 212 may be selected to preferentially direct light to an outer region or an inner region of the substrate when the substrate is disposed on the substrate support assembly For example, given a depth S, a spacing D, and an angle $\theta$. The lens 128 may direct the incoming light to an outer edge of the substrate 101 when disposed on the substrate support assembly 114. In another example, given a depth $D_2$, spacing $S_2$, and angle $\theta_2$, the lens 128 may be configured to direct the incoming light to a center of the substrate 101. In another example, modulating the valleys (areas between the center edge) may be used to direct the incoming light towards an area of interest on the substrate 101. In addition to the depth 208, spacing 210, and angle 212 of the features 204, the positioning of the features 204 formed in the body 202 aid in adjusting where the light is directed on the substrate 101. Moreover, the position of the lens with respect to the sources impacts the overall irradiance profile. For example, the closer the lens is to the source, the greater impact the lens 128 will have on the overall irradiance profile. Additionally, the closer the lens 128 is to the substrate 101, the stronger the correlation between the positions of the features 204 on the lens 128 with the intensity changes on the substrate 101. For example, when the features 204 are formed near the periphery of the lens 128, there will be intensity changes towards the edge of the substrate 101. However, as the lens 128 may be moved closer to the light source, 120 the correlation between the position of the features 204 on the lens 128 and the intensity of changes on the substrate 101 is not as clear. For example, as shown, the features 204 are formed near a periphery of the lens 128, and are configured to direct light to the outer edge of the substrate 101. For example, the features 204 may be formed such that the features fall outside the diameter of the secondary reflector 126. In another example, the features 204 may be formed closer to a center of the lens 128, and be angled such that that the features 204 direct light just about the center of the lens 128. Additional features 204 are illustrated in phantom in FIG. 2A, corresponding to different areas of interests on the substrate 101.

In operation, the UV light is channeled using a reflector (either primary or secondary). The channeled UV light is directed with a lens having a plurality of features formed therein. The channeled UV light is directed to an area of interest on a substrate positioned in a UV processing chamber. In one embodiment, a property of a film formed on a substrate is changed by exposure to the direct UV light.

Thus, the lens 128 provides an additional knob for controlling substrate uniformity without the need for replacing additional chamber 100 components.

While the foregoing is directed to specific embodiments, other and further embodiments may be devised without departing from the basic scope thereof, and the scope thereof is determined by the claims that follow.

What is claimed is:

1. A processing chamber, comprising:
   a chamber body having an upper housing and a lower housing defining an interior volume of the processing chamber, the interior volume having a first area and a second area separated by a quartz window;
   a substrate support assembly disposed in the second area, the substrate support assembly configured to support a substrate;
   two light sources disposed above the substrate support assembly in the first area, wherein each light source comprises a bulb disposed in a parabolic shaped primary reflector; and
   a plurality of lenses disposed between the two light sources and the quartz window, a first set of the plurality of lenses disposed adjacent the two light sources, a second set of the plurality of lenses coupled to a secondary reflector and disposed between the first set of lenses and the quartz window, the plurality of lenses having a plurality of features formed therein that are configured to direct light from the two light sources preferentially to an area of interest on the substrate when disposed on the substrate support assembly.

2. The processing chamber of claim 1, wherein the plurality of features are exterior to a body of each lens of the plurality of lenses.

3. The processing chamber of claim 1, wherein the plurality of features include a depth, spacing, and angle selected to preferentially direct light to an outer region or an inner region of the substrate when the substrate is disposed on the substrate support assembly.

4. The processing chamber of claim 1, wherein the plurality of features are engraved in each lens of the plurality of lenses.

5. The processing chamber of claim 1, wherein the plurality of features are concentric.

6. The processing chamber of claim 1, wherein each lens of the plurality of lenses includes a body, and wherein the features of each lens of the plurality of lenses are formed at least partially into the body.

* * * * *